United States Patent [19]
Grieger et al.

[11] Patent Number: 6,044,851
[45] Date of Patent: Apr. 4, 2000

[54] CLEANING COMPOSITION CONTAINING TETRAALKYLAMMONIUM SALT AND USE THEREOF IN SEMICONDUCTOR FABRICATION

[75] Inventors: Eric K. Grieger; Michael T. Andreas; Michael A. Walker, all of Boise, Id.

[73] Assignee: Micron Technology, Inc., Boise, Id.

[21] Appl. No.: 09/097,557

[22] Filed: Jun. 15, 1998

Related U.S. Application Data

[63] Continuation of application No. 08/725,579, Oct. 3, 1996, Pat. No. 5,855,811.

[51] Int. Cl.[7] .................. C09K 13/08; C09K 13/06; C11D 9/04; B08B 6/00; H01L 21/302
[52] U.S. Cl. .................. 134/1.3; 252/79.3; 252/79.4; 216/89; 216/97; 438/692; 438/750; 510/176
[58] Field of Search .................. 134/1.3; 252/79.3, 252/79.4; 438/692, 750; 216/89, 97; 510/176

[56] References Cited

U.S. PATENT DOCUMENTS

| | | | |
|---|---|---|---|
| 4,339,340 | 7/1982 | Muraoka et al. | 252/79.5 |
| 4,581,101 | 4/1986 | Senoue et al. | 156/643 |
| 4,722,883 | 2/1988 | Koibuchi et al. | 430/323 |
| 4,807,016 | 2/1989 | Douglas | 357/67 |
| 5,240,878 | 8/1993 | Fitzsimmons et al. | 437/187 |
| 5,300,463 | 4/1994 | Cathey et al. | 437/228 |
| 5,340,370 | 8/1994 | Cadien et al. | 51/308 |
| 5,354,490 | 10/1994 | Yu et al. | 252/79.1 |
| 5,389,194 | 2/1995 | Rostoker et al. | 156/636 |
| 5,407,526 | 4/1995 | Danielson et al. | 156/636 |
| 5,448,097 | 9/1995 | Mizushima et al. | 257/435 |
| 5,478,436 | 12/1995 | Winebarger et al. | 156/636.1 |
| 5,705,089 | 1/1998 | Sugihara et al. | 252/79.1 |
| 5,716,535 | 2/1998 | Lee et al. | 216/99 |
| 5,747,381 | 5/1998 | Wu et al. | 438/624 |
| 5,783,495 | 7/1998 | Li et al. | 438/738 |

FOREIGN PATENT DOCUMENTS

| | | |
|---|---|---|
| 0601 532 A2 | 6/1994 | European Pat. Off. . |
| 208886 A1 | 11/1984 | Germany . |
| 54-7092 | 10/1980 | Japan . |
| 4-278921 | 8/1994 | Japan . |

*Primary Examiner*—Benjamin L. Utech
*Assistant Examiner*—George Goudreau
*Attorney, Agent, or Firm*—Dorsey & Whitney LLP

[57] ABSTRACT

A composition prepared from water, hydrofluoric acid (HF) and tetraalkylammonium hydroxide (TAAH, preferably tetramethylammonium hydroxide (TMAH)) or tetraalkylammonium fluoride and solvent with or without HF or TAAH is used to clean residue from a semiconductor wafer, where the residue is formed as a result of a planarization process, such as chemical mechanical polishing. Incorporation of TMAH into an aqueous HF composition retards the rate at which the composition dissolves borophosphosilicate (BPSG) without effecting the rate at which silica is dissolved. Thus, the aqueous HF/TMAH composition may be used to completely remove silica-containing residue from a BPSG surface, with a tolerable level of BPSG removal.

70 Claims, 2 Drawing Sheets

CLEANING COMPOSITION CONTAINING TETRAALKYLAMMONIUM SALT AND USE THEREOF IN SEMICONDUCTOR FABRICATION

This application is a continuation of application Ser. No. 08/725,579, filed Oct. 3, 1996, now U.S. Pat. No. 5,855,816.

TECHNICAL FIELD

The present invention relates to semiconductor fabrication, and more particularly to removing residue from a semiconductor wafer that has been subjected to planarization.

BACKGROUND OF THE INVENTION

The present-day fabrication of semiconductor wafers is a complex multi-step process. In a typical process, various materials are sequentially applied to a substrate in order to build up a substantially laminar structure. After a layer has been laid down, selected regions of that layer are commonly modified or removed. Such manipulations often impart nonplanarity to the top surface of the layer. Nonplanarity, also known as uneven surface topography, is undesirable for a number of reasons, one of which is that laying down a subsequent layer is made more difficult if the underlying layer is nonplanar. Therefore, a common step during semiconductor wafer fabrication is to planarize the surface of the wafer, by a process known as planarization or polishing, where these terms are often used interchangeably.

There are a large number of specific processes that can be used to planarize the surface of a semiconductor wafer, a few of which will be discussed later herein. However, it is generally the case that planarization will selectively remove surface material that constitutes the highest points of the surface, i.e., the points of the surface furthest from the base of the semiconductor wafer. In this way, the high points are removed and the surface topography of the wafer is planarized, also called leveled or flattened. The planarization process can be carried out on an already planar surface, in which case an entire layer of a semiconductor wafer may be removed. Regardless of the amount of material that is removed by a planarization process, a typical consequence of planarization is that a residue is left on the planarized surface. This residue may be termed planarization residue.

The exact identity of the residue depends on the details of the planarization process, however at a minimum the residue typically includes bits and particles which have been dislodged from the surface, and often includes materials that were used to assist the planarization process. At the end of the planarization process, this residue should be completely removed before any further layers may be laid down upon the semiconductor surface.

Pure water, optionally in combination with scrubbing, is commonly used in the art to remove planarization residue. However, the prior art also describes methods and compositions which have been developed to more effectively and efficiently remove planarization residue from a semiconductor surface. For example, U.S. Pat. No. 5,478,436 to Winebarger et al. is directed to applying a cleaning solution to a semiconductor substrate having metal contaminants thereon, in order to remove the metal contaminants. The Winebarger et al. cleaning solution comprises an organic solvent and a compound containing fluorine. As another example, U.S. Pat. No. 5,389,194 to Rostoker et al. is directed to a method of cleaning polishing residue from a semiconductor device. The Rostoker et al. method uses a cleaning solution consisting essentially of phosphoric acid and hydrofluoric acid.

As recognized by both Winebarger et al. and Rostoker et al., a problem with the use of chemical-containing cleaning solutions for removing planarization residue is that, in order for the cleaning process to be effective, the cleaning solutions are so strong that they degrade/dissolve the surface layer itself. That is, the cleaning solutions cause undesirable degradation and/or removal of the surface of the planarized layer. While Winebarger et al. and Rostoker et al. both purport to address this problem, there is still a significant need in the art for satisfactory processes and cleaning solutions for selectively removing planarization residue from a semiconductor surface.

SUMMARY OF THE INVENTION

The present invention provides a process for effectively removing planarization residue from a planarized surface, with acceptable affects on the planarized surface itself. The process comprises the steps of providing a semiconductor wafer surface having residue thereon, where the residue is a consequence of a planarization process, and then contacting the residue with a cleaning composition to remove at least some of the residue from the surface. In a preferred embodiment of the invention, the cleaning composition is a solution comprising tetraalkylammonium fluoride (TAAF) of the formula $(R)_4NF$ wherein each occurrence of R is independently a $C_{1-22}$alkyl group. In another preferred embodiment of the invention, the composition results from the combination of solvent, hydrofluoric acid (HF) and tetraalkylammonium hydroxide (TAAH), where TAAH has the formula $(R)_4NOH$ and each occurrence of R is independently a $C_{1-22}$alkyl group.

Another aspect of the invention is a process for fabricating a semiconductor device. The process includes the steps of providing a semiconductor device having a surface, and then planarizing the surface to provide a planarized surface having residue thereon. The residue is contacted with a cleaning composition as described above. In this way, a semiconductor device may be planarized, and then residue from the planarization process may be subsequently removed.

A related aspect of the invention is a semiconductor device that has been prepared by the above-described process.

A further related aspect of the invention is a preferred process for preparing a cleaning composition useful in the above-processes. The preferred process includes the steps of adding hydrofluoric acid (HF) to water to form dilute HF, and then adding TAAH to the dilute HF. In a preferred embodiment of the invention, 0.01 to 100 volume parts of 0.1 to 50 wt % aqueous HF are added to 100 volume parts of water to form dilute HF, and then 0.01 to 100 volume parts of 0.1 to 25 wt % aqueous TAAH are added to the dilute HF. More preferably, 0.1 to 10 volume parts of 10 to 50 wt % aqueous HF are added to 100 volume parts of water to form dilute HF, and then 0.1 to 10 volume parts of 5 to 25 wt % aqueous TAAH are added to the dilute HF. Preferably, the TAAH is tetramethylammonium hydroxide. In a preferred embodiment, at least one organic solvent and/or at least one surfactant is additionally added to the cleaning composition.

The invention is also directed to a preferred composition that may be used to clean residue from a surface previously subjected to planarization. According to one aspect of the invention, the composition results from the combination of water, hydrofluoric acid (HF), tetraalkylammonium hydroxide and at least one of organic solvent and surfactant. According to another aspect of the invention, the composition results from combining tetraalkylammonium fluoride and at least one of water, organic solvent and surfactant. In a preferred embodiment, the cleaning composition results from the combination of water, 0.1–49 wt % aqueous HF and 0.1–25 wt % (aqueous or non-aqueous) TAAH in a water:HF solution:TAAH solution volume parts ratio of 100:0.01-100:0.01-100. More preferably, the volume parts ratio is 100:0.1-10:01.-10, and still more preferably the volume parts ratio is 100:0.5-2:0.5-5. One preferred cleaning composition has an alkaline pH, for example, a pH of about 9 to about 13, and preferably about 11. Another preferred cleaning composition has an acidic pH, for example, a pH of about 1 to about 5, preferably about 3.5. The group "R" in the TAAH or TAAF is preferably independently $C_{1-4}$alkyl at each occurrence, where the TAAH is preferably tetramethylammonium hydroxide. A surfactant is preferably present in the composition at a concentration of about 0.001 to about 5.0 wt %, more preferably about 0.01 to 1 wt % based on the total weight of cleaning composition, where preferred surfactants are nonionic, and suitable surfactants are TRITON-X (Rohm and Haas Co., Philadelphia, Pa.) and ACATIONOX (Baxter-Scientific, McGaw Park, Ill.). An organic solvent may be present in a preferred composition, where the organic solvent is preferably present at a concentration of about 0.01 to about 95 wt % based on the total weight of the composition. In a preferred embodiment, the organic solvent contains hydroxyl functionality. Suitable organic solvents include methanol, ethanol, n-propanol, iso-propanol, ethylene glycol and propylene glycol.

These and other aspects of this invention will become apparent upon reference to the following detailed description and attached drawings.

DETAILED DESCRIPTION OF THE INVENTION

Figure 1:
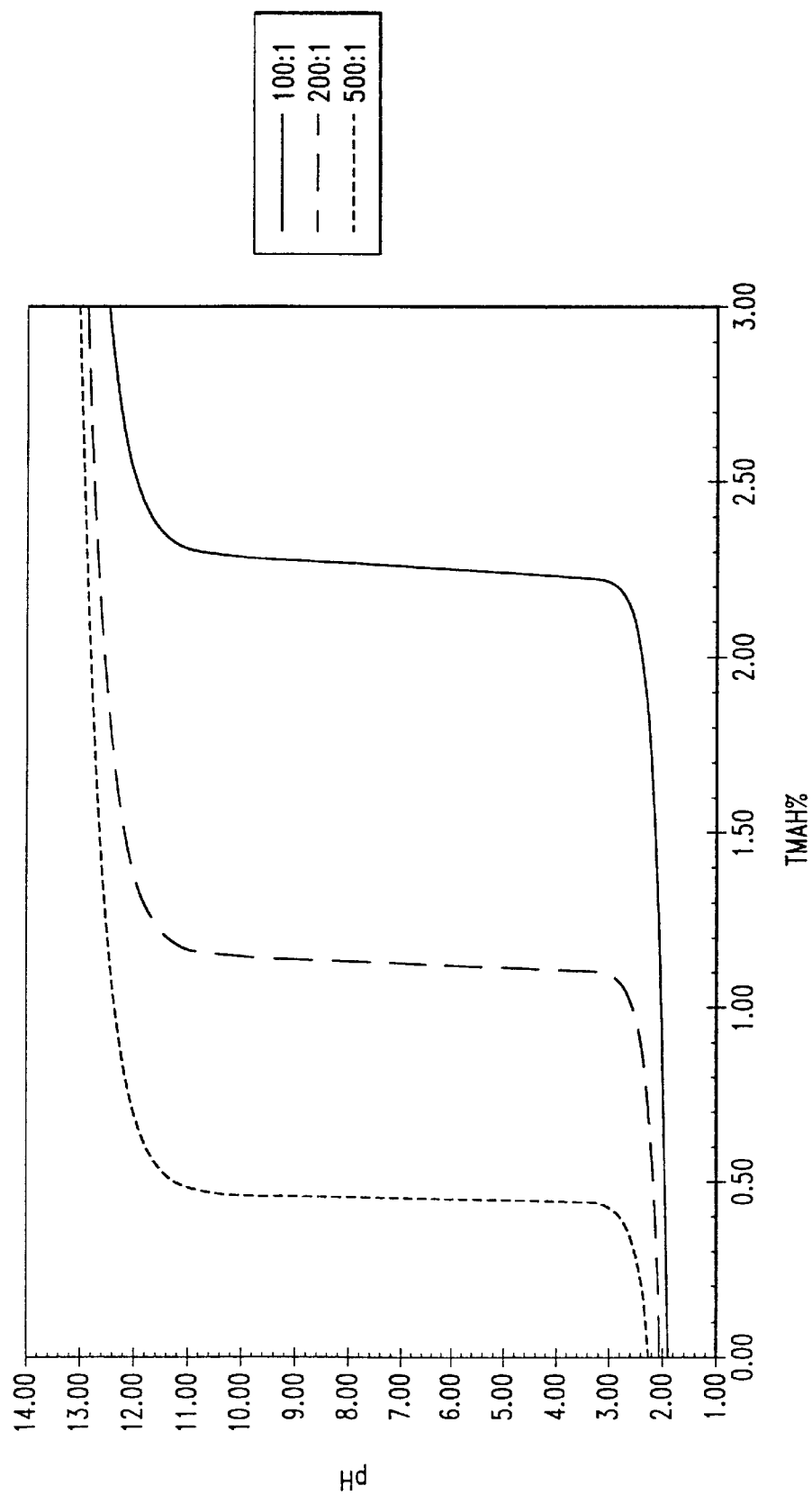
FIG. 1 is graphical representation of the effect on pH of titrating TMAH into aqueous HF of various concentrations.

The present invention provides a composition that is useful in removing residue from the surface of a semiconductor wafer that has been subjected to planarization. In a preferred embodiment of the invention, the composition comprises a solution of tetraalkylammonium fluoride (TAAF). In another preferred embodiment of the invention, the composition results from combining at least the following three chemicals: solvent, and preferably water ($H_2O$ and/or isotopes thereof, hereinafter simply "water"), hydrogen fluoride (HF and/or isotopes thereof, hereinafter simply "HF") and tetraalkylammonium hydroxide (TAAH and/or isotopes thereof, herein after simply "TAAH"). This later cleaning composition, when it contains water, may be referred to herein as aqueous HF/TAAH or, more simply, as aq. HF/TAAH.

The phrase "the composition results from combining" solvent, HF and TAAH as used herein is meant to refer to the composition itself, regardless of how that composition is prepared and regardless of what that composition contains. Thus, the cleaning composition used in the invention may be prepared by means other than combining solvent, HF and TAAH, and still afford the composition of the present invention as long as the same composition could have been formed by combining solvent, HF and TAAH. Preferably, the cleaning composition is prepared by combining water, HF and TAAH.

Furthermore, it is not necessarily the case that the composition which results from a combination of solvent, HF and TAAH contains each of solvent, HF and TAAH. It may or may not happen that two or more of these ingredients react together upon combination and form a reaction product which has a chemical structure unlike the starting materials. Because HF is an acid and TAAH is a base, there may be some ion exchange that takes place when these materials are combined, such that tetraalkylammonium fluoride (TAAF) and water is formed. However, the cleaning compositions of the present invention encompass compositions that are the result of such chemical reaction and/or ion exchange.

The TAAF has the formula $(R)_4NF$, and can be described as the fluoride salt of a tetraalkylammonium ion. Each alkyl group, R, of the ammonium ion has at least one and may have as many as about 22 carbon atoms, i.e., is a $C_{1-22}$alkyl group. The carbon atoms of each R group may be arranged in a straight chain, a branched chain, a cyclic arrangement, and any combination thereof. Each of the four R groups of TAAF are independently selected, and thus there need not be the same arrangement or number of carbon atoms at each occurrence of R in TAAF. For example, one of the R groups may have 22 carbon atoms, while the remaining three R groups each have one carbon atom. Tetramethylammonium fluoride (TMAF) is a preferred TAAF. Tetraethylammonium fluoride (TEAF) is another preferred TAAF. A preferred class of TAAF has alkyl groups with one to about four carbon atoms, i.e., R is a $C_{1-4}$alkyl group, while another preferred class of TAAF has alkyl groups with two to about four carbon atoms, i.e., R is a $C_{2-4}$ alkyl group. The TAAF may be a mixture, e.g., a mixture of TMAF and TEAF.

Tetramethylammonium fluoride is available commercially as the tetrahydrate, with a melting point of 39–42° C. Aldrich Chemical Co., Milwaukee, Wis., sells this tetramethylammonium fluoride. The hydrate of tetraethylammonium fluoride is also available from the Aldrich Chemical Co. Either of these materials, which are exemplary only, may be used in the practice of the present invention. Tetraalkylammonium fluorides which are not commercially available may be prepared in a manner analogous to the published synthetic methods used to prepare TMAF and TEAF, which are known to one of ordinary skill in the art.

To prepare a cleaning composition from TAAF, the TAAF is combined with a solvent. The solvent may be water, an organic solvent, or a combination thereof. Suitable organic solvents include hydroxyl-containing solvents such as methanol, ethanol, n-propanol, iso-propanol, n-butanol, t-butanol, iso-butanol, sec-butanol, ethylene glycol, propylene glycol and mono- and polyhydric alcohols having higher carbon number. The composition is easily prepared simply by combining TAAF and solvent, and mixing these materials together to form a homogeneous composition, preferably a solution.

The solvent from which the cleaning composition may be prepared is preferably a pure water, in other words, is preferably water that is completely or substantially free of organic and inorganic material. Impurities are undesirable for several reasons, a primary reason being that the impurities may find their way onto the semiconductor device being cleaned of residue, and thus hinder the formation of a clean surface. Some spring waters are naturally pure, and are suited for use in the present invention. Otherwise, impure water may be brought to the pure state preferred for the invention by one or more of a number of techniques known in the water-purification art, including distillation (which provides "distilled water") and/or passing the water through an ion exchange resin (which provides "deionized water"). In fact, distilled water is essentially free of metal ions, and so may also be referred to as a deionized water. The water may be repeatedly passed through distillation columns and/or ion exchange resins to increase the purity of the water. Distillation equipment and ion exchange resins are commercially available from a number of sources, as listed in, for example, The Thomas Directory. Purified water is available from, e.g., Aldrich Chemical Co., Milwaukee, Wis. among many other suppliers.

However, any liquid material which dissolves the HF, TAAH and/or TAAF may be employed as the solvent. Alcohols are a preferred class of solvent, where lower molecular weight alkanols such as $C_{1-4}$ monohydric or dihydric alcohols are preferred.

HF, which is a gas, will cause serious harm when contacted with human skin, and thus should be a handled very carefully. It is available commercially as a solution in water, and it is preferably obtained and worked with in that form (albeit still very carefully, as aqueous HF is also hazardous to human skin). Aldrich Chemical Co., among many other suppliers, sells aqueous HF at various HF concentrations. Essentially any concentration of HF in water may be employed in preparing the inventive compositions, for example, compositions having from about 0.1 wt % to about 50 wt % HF in water are suitable. An aqueous HF containing essentially 49 wt % HF and 51 wt % water is a standard material of commerce, and is a preferred material for use in the present invention. If a non-aqueous cleaning composition is desired, then HF gas may be bubbled into an organic solvent, such as methanol, to which may also be added TAAF or TAAH.

The TAAH has the formula $(R)_4NOH$, and can be described as the hydroxide salt of a tetraalkylammonium ion. Each alkyl group, R, of the ammonium ion has at least one and may have as many as about 22 carbon atoms, i.e., is a $C_{1-22}$alkyl group. The carbon atoms of each R group may be arranged in a straight chain, a branched chain, a cyclic arrangement, and any combination thereof. Each of the four R groups of TAAH are independently selected, and thus need not have the same arrangement or number of carbon atoms at each occurrence. For example, one of the R groups may have 22 carbon atoms, while the remaining three R groups each have one carbon atom. Tetramethylammonium hydroxide (TMAH) is a preferred TAAH. Tetraethylammonium hydroxide (TEAH) is another preferred TAAH. A preferred class of TAAH has alkyl groups with one to about four carbon atoms, i.e., R is a $C_{1-4}$alkyl group, while another preferred class of TAAH has alkyl groups with two to about four carbon atoms, i.e., R is a $C_{2-4}$alkyl group. The TAAH may be a mixture, e.g., a mixture of TMAH and TEAH.

TMAH is commercially available as the pentahydrate (a solid, with a melting point of 65–68° C.) at a purity of 99% from Aldrich Chemical Co. Solutions of TMAH are also commercially available. For example, Aldrich Chemical Co. sells 10 wt % and 25 wt % TMAH in water, and 25 wt % TMAH in methanol. TMAH from any of these sources is suitably employed in preparing the cleaning composition of the invention. Other tetraalkylammonium hydroxides are also commercially available. For example, tetraethylammonium hydroxide (TEAH), tetrapropylammonium hydroxide (TPAH) and tetrabutylammonium hydroxide (TBAH) are available from Aldrich Chemical Co. Tetraalkylammonium hydroxides which are not commercially available may be prepared in a manner analogous to the published synthetic methods used to prepare TMAH, TEAH, TPAH and TBAH, which are known to one ordinary of skill in the art. TAAH may be dissolved in water at essentially any concentration, and be suitable for use in preparing the cleaning composition. For example, a TAAH concentration of about 0.1 wt % to about 25 wt % in solvent (preferably water) is suitable.

Each of the solvent, TAAF, HF and TAAH is preferably of electronic grade purity or better.

As stated above, the cleaning composition may be prepared from solvent, HF and TAAH or from TAAF and a solvent. The composition may additionally be prepared from optional components. A preferred optional component is a surfactant. The surfactant may be nonionic, cationic or anionic. TRITON-X (Rohm and Haas, Philadelphia, Pa.) and ACATIONOX (Baxter-Scientific, McGaw Park, Ill.) are preferred, commercially-available non-ionic surfactants.

Where water is the solvent, another preferred optional component is one or more organic solvents. Low molecular weight solvents containing one or more hydroxyl groups are a preferred class of organic solvent. Exemplary hydroxyl-containing solvents include, without limitation, methanol, ethanol, n-propanol, iso-propanol, n-butanol, t-butanol, iso-butanol, sec-butanol, propylene glycol and ethylene glycol. The organic solvent may be present in an amount ranging from about 0.01 wt % to about 95 wt %, so that the cleaning composition may be completely aqueous, or may be essentially organic with water present as only a minor ingredient.

Still other optional ingredients include, without limitation, acetic acid, citric acid, phosphoric acid, ammonia and other common process chemicals.

The precise amounts of solvent, TAAF, HF and TAAH used to form the cleaning composition can each vary over a very wide range. As expressed in volume parts (a general term to represent, e.g., gallons, liters, etc.) and using water as an exemplary solvent, to every 100 volume parts of water used to form the composition, between about 0.01 to 100 volume parts 49 wt % HF and between about 0.01 to 100 volume parts 25 wt % TAAH may be used. Expressed in a volume parts ratio, this is equivalent to 100:0.01-100:0.01-100. Stated in the same terms (water:49 wt % HF:25 wt % TAAH), a preferred volume parts ratio is 100:0.1-10:0.1-10, and a more preferred volume parts ratio is 100:0.5-2:0.5-5.

The relative amounts of HF and TAAH used in forming the cleaning composition will be reflected in the final pH of the composition. This is illustrated in FIG. 1, which shows the pH of various cleaning compositions of the invention. The lines designated 100:1, 200:1 and 500:1 refer to compositions prepared from the indicated volume parts of water:indicated volume parts of 49 wt % HF. Thus, 100:1 refers to a composition prepared from 100 volume parts water and 1 volume part 49 wt % HF. The value "TMAH %" shown on the x-axis indicates the weight percent of TMAH added to a particular composition, while the y-axis indicates the corresponding pH of the composition. The behavior shown in FIG. 1 is based on the published equilibrium constants for HF and TMAH in water.

As shown in FIG. 1, the pH of an aqueous HF composition is essentially constant, up to a point, as TMAH is added to the composition. However, depending on the initial concentration of the aqueous HF, at some point the pH rapidly changes from acidic, and specifically from about 1 to about 3, to alkaline, and specifically from about 11 to about 13. A composition that has a greater concentration of HF requires more TMAH to become alkaline. Thus, a composition prepared from 100 volume parts water and 1 volume part of 49 wt % aqueous HF (see solid line in FIG. 1) will maintain an acidic pH of about 2–3, until about 2.2 wt % TMAH has been added (as a 25 wt % aqueous solution). However, when 500 volume parts water and 1 volume part of 49 wt % aqueous HF are combined (see dashed line in FIG. 1) only about 0.4 wt % TMAH need be added to change the solution from acidic to basic.

Preferred compositions of the invention are acidic, and more preferably have a pH of about 1–5. However, alkaline compositions, and specifically compositions having a pH of about 9 to about 13, preferably about 11, may also be used in the invention and thus are also desirable.

The cleaning composition of the invention may be prepared from solvent (where water is a preferred solvent), HF and TAAH. While these ingredients may be combined in any order, a preferred order is the following. HF, preferably aqueous HF, is added gradually to the solvent (preferably water) to form dilute HF. Then aqueous TAAH is added gradually to the dilute HF. Each of the additions is preferably accompanied with stirring, or some other mechanized mixing process.

In a preferred process for preparing the cleaning composition, 0.01 to 100 volume parts of 0.1 to 50 wt % aqueous HF are added to 100 volume parts of water to form dilute HF, and then 0.01 to 100 volume parts of 0.1 to 25 wt % aqueous TAAH are added to the dilute HF. More preferably, 0.1 to 10 volume parts of 10 to 50 wt % aqueous HF are added to 100 volume parts of water to form dilute HF, and then 0.1 to 10 volume parts of 5 to 25 wt % aqueous TAAH are added to the dilute HF. It should be understood that "volume parts" refer to volumes that are relative to the other volumes used in the process. Thus, a process wherein 100 volume parts water are combined with 100 volume parts 49 wt % HF describes all processes wherein equal volumes of water and 49 wt % are combined.

When preparing a cleaning composition from TAAF, the TAAF is combined with a solvent to achieve a TAAF concentration of 0.01 to 10 weight percent, preferably 0.05 to 5 weight percent, and more preferably 0.1 to 2 weight percent based on the total weight of the cleaning composition. The TAAF-containing composition is preferably aqueous, in that there is at least some water present in the cleaning composition. The composition may have a neutral, acidic or alkaline pH, however preferably the pH is acid or alkaline, and more preferably the pH is acidic. A pH of about 1–5 is preferred with a pH of about 3.5 being more preferred. The cleaning composition may be made acidic through e.g., the addition of hydrofluoric acid to the TAAF/solvent composition, or may be made alkaline through, e.g., the addition of TAAH to the TAAF/solvent composition. An exemplary cleaning composition may be prepared by mixing together 425 g of tetramethylammonium fluoride, 70 mL of 25% aqueous hydrofluoric acid and 50 liters of water. A cleaning composition may also be prepared from TAAF, TAAH, HF and, optionally, water.

When a composition containing surfactant and/or organic solvent is to be prepared, the surfactant and/or organic solvent may be added to the cleaning composition at any time.

Having fully described the cleaning composition of the invention and its preparation, its use in semiconductor fabrication will be described next. According to the invention, the cleaning composition is employed to remove residue that results from a planarization process. As used herein, the term planarization includes within its meaning the typical meaning given to "planarization" in the art. Thus, planarization is intended to include processes sometimes referred to in the art as flattening, leveling, smoothing, global planarization, local planarization and the like, where such terms convey the idea that the process provides for a planar surface. In addition, planarization as used herein includes polishing processes. Sometimes "polishing" and "planarization" processes are distinguished from each other in the art (see, e.g., U.S. Pat. No. 5,441,094), however quite commonly these terms are used interchangeably. Nevertheless, for purposes of describing the present invention, planarization includes those processes that are sometimes referred to in the art as polishing, including blanket polishing, as long as a residue results. Thus, planarization as used herein specifically includes mechanical polishing (MP) and chemical-mechanical polishing (CMP), where the MP or CMP is used for providing a planar surface or for any ultimate purpose, such as simply removing a layer from a semiconductor device. In fact, CMP is a preferred planarization process according to the present invention.

Planarization as used herein includes, but is not limited to, the planarization (or polishing, leveling etc.) processes which are described and/or discussed in the following U.S. patents, which are fully incorporated herein by reference for all purposes: U.S. Pat. Nos. 5,486,265; 5,461,007; 5,459,096; 5,457,070; 5,451,551; 5,449,314; 5,445,996; 5,441,094; 5,434,107; 5,433,650; 5,422,289; 5,395,801; 5,385,866; 5,362,669; 5,356,513; 5,354,490; 5,340,370; 5,332,467; 5,318,663; 5,169,491; 5,084,419 and 5,084,071. CMP is a preferred planarization process, and apparatus to perform CMP are described in the following U.S. patents, which are fully incorporated herein by reference for all purposes: U.S. Pat. Nos. 5,486,129; 5,435,772; 5,142,828; 5,036,015 and 3,841,031.

In addition, planarization as used herein includes those dry etching processes that are directed to providing a planar surface. See, e.g., the discussion in U.S. Pat. No. 5,407,526 to Danielson, et al., wherein a dielectric layer having an uneven surface is coated with a layer of metal, to thereby fill in the indentations of the dielectric layer. Thereafter, the metal layer is evenly removed by dry etching until the dielectric layer is exposed, and a planar surface composed of dielectric and regions of metal, results. Danielson et al., which is fully incorporated herein by reference for all purposes, states that this dry etching process typically leaves etch residue and metal particles on the planarized surface.

Another method which is used to produce a planar semiconductor wafer surface is to initially spin coat the wafer with photoresist. The spin coating of photoresist on the wafer surface fills the low points and produces a planar upper surface from which to start. Next, a dry etch which removes photoresist and oxide at a rate sufficiently close to 1:1, removes the photoresist and the high points of the wafer, thereby producing a substantially planarized oxide layer on the wafer surface. This process may also generate residue on the planarized oxide surface, after the dry etching process is complete.

It is very typically the case that planarization will leave some residue on the planarized surface. The prior art contains many references to such residue. See, e.g., U.S. Pat. No. 5,434,107 to Paranjpe, which refers to post-process wafer clean up after chemical mechanical polishing, and to U.S. Pat. No. 5,407,526 to Danielson et al., as discussed above. Such residue is variously referred to in the art as planarization residue, etch residue, post-planarization residue or simply residue. Such residue may also be called contaminant, polishing residue, film residue, debris, detritus and the like. The present invention is directed to semiconductor fabrication wherein a planarization process achieves both a planar surface and residue on that surface, regardless of the specific name given in the art to that residue.

Because planarization residue has been frequently referred to in the prior art, it is believed that one of ordinary skill in the art readily recognizes planarization residue as that term is used herein. In general, the precise composition of the planarization residue depends on a number of factors, including the details of the planarization process and the composition of the surface being subjected to planarization. It is generally true, however, that the planarization residue is not chemically bonded to the surface of the semiconductor device, where "chemically bonded" refers to the chemical bonds that bind together the surface atoms of the semiconductor device. The chemical bonds that bind these surface atoms are generally covalent bonds, and thus the planarization residue being contemplated by the invention is not covalently bound to the semiconductor device. Instead, the planarization residue sits on top of a semiconductor device, and may held in place by friction, ionic bonds, van der Waals forces and other non-covalent bonds.

A single planarization residue may consist of a variety of chemical species which are formed during a planarization process. For example, where planarization physically abrades the surface of the semiconductor device, this may give rise to particles of residue that have the same chemical composition as the device surface. In some instances, planarization may achieve physical abrasion along with chemical reactions at the device surface, where the chemical reactions facilitate removal of surface atoms. In this instance, the residue may contain particles that have the same composition as the surface, as well as particles that have modified compositions.

As another example, the wafer surface may be photoresist, in which case the planarization residue may be pieces of either cured or uncured photoresist. As yet another example, the wafer surface may be spin-on-glass (SOG), in which case the planarization residue may be particles of SOG.

In addition, the planarization residue may consist, in part or in whole, of abrasives that were used in the planarization process. This is particularly likely to be true where the planarization process is chemical-mechanical polishing (CMP). CMP typically employs a particulate abrasive, along with a solvent, a surface-reactive chemical (e.g., an oxidizer, reducer and/or etchant) and a polishing pad. The particulate abrasive may be formed from any of a large number of materials, including aluminum oxide (alumina), boron carbide, boron suboxide (see, e.g., U.S. Pat. No. 5,456,735 to Ellison-Hayashi), cerium oxide (ceria); silicon carbide, and probably most commonly, silicon dioxide (silica, colloidal silica), to name a few. Thus, the planarization residue may contain one or more of these abrasives.

One aspect of the present invention is a method of removing such residue from a surface after a planarization process. The problem of removing planarization residue after a planarization process has been addressed in the semiconductor fabrication art. See, e.g., U.S. Pat. No. 5,478,436 to Winebarger et al. and U.S. Pat. No. 5,389,194 to Rostoker et al., where both of these patents are directed to chemical compositions reportedly useful in removing planarization residue from a semiconductor device. Both of these patents are fully incorporated herein by reference for all purposes. Methodology for using the inventive compositions to remove planarization residue will be discussed next.

To allow the cleaning composition of the invention to remove planarization residue from a planarized semiconductor device, the composition must be contacted with the residue. Any method known in the art for using a liquid composition to assist in, or achieve, removal of planarization residue may also be practiced with the inventive composition. For example, the residue-removal methods described in either of U.S. Pat. No. 5,478,436 and 5,389,194, already incorporated herein by reference, may be employed using the aqueous HF/TAAH or TAAF composition of the invention. However, a few specific methods according to the invention that can be used to remove planarization residue will now be described.

A semiconductor device having planarization residue may be placed into a bath of the cleaning composition (where the "cleaning composition" includes a liquid composition comprising TAAF and/or the result of combining solvent, HF and TAAH, both as described herein), whereupon planarization residue will become suspended, dispersed and/or dissolved in the cleaning composition and the device surface will become relatively free of the residue. It is also possible to place the residue-containing device into a bath comprising one or two components of the cleaning composition (e.g., water and TAAH), and then meter-in the remaining one or two components (e.g., HF). Elevated temperature may be employed to hasten residue removal, although elevated temperature may concomitantly and undesirably hasten removal of atoms that form the planarized surface, as discussed later herein.

It is preferred that some mechanical action take place while the cleaning composition contacts the residue-containing device surface, in order to facilitate removal of the residue from the surface. For example, the bath of cleaning composition may be a recirculating bath, in order that a current of cleaning composition regularly passes over the residue-containing surface. Alternatively, or in addition, the bath may be an ultrasonic or megasonic bath (depending on the frequency of vibration). As another example, the cleaning composition may be sprayed onto the device surface, where the spray pressure assists in removing residue from the device surface. As a further example, scrubbing action, as provided, for example, by a brush, in combination with the cleaning composition, may be employed. Devices (known as scrubbers) intended for the removal of planarization residue, which provide scrubbing action through brushes (typically brushes made from PVA), are commercially available and known to one of ordinary skill in the art.

The preferred method of contacting the residue-containing surface with the cleaning composition may depend, in part, on the nature of the residue-containing surface and the details of the planarization process that formed the residue. For example, where chemical-mechanical polishing has been used with an alumina slurry to remove tungsten metal from a device surface, the device may be placed into a circulating or non-circulating ultrasonic or megasonic bath of water and TMAH, and then a dilute solution of HF is gradually added to the bath. After some time, the device is removed from this bath, rinsed with water, and then placed into a scrubber with TMAH and water at an alkaline pH, for example greater than about 9.5. Thereafter the device is again rinsed with water and is essentially free of planarization residue. The device may be dried (i.e., freed of solvent) by Marangoni drying, as known in the art. As illustrated by this procedure, contacting a residue-containing device with the cleaning composition of the present invention may be one of several separate steps in a process to remove planarization residue from a device surface.

As illustrated by the above example, it is not necessary to pre-form the cleaning composition before contacting the composition with the residue-containing surface. The surface may first be contacted with one or two of the components used to prepare the cleaning composition, and then the remaining components may be added, either alone or separately, either in one shot or metered in. Because various components of the composition may be metered into a batch solution at various times and rates, it is difficult to precisely define the concentration of each of the components that are contacted with the surface. However, the inventive method includes the method wherein the various components of the cleaning composition are sequentially added to an environment that also contains the residue-containing surface.

The inventive composition and methods may also be employed in instances where the planarization residue results from chemical mechanical polishing of TEOS-derived ILD (interlayer dielectric) surface material or doped silica glass. In these cases, the planarized device may be placed in a bath of aqueous HF/TMAH, followed by a megasonic bath of aqueous TMAH, followed by being scrubbed in an aqueous bath, optionally with one or more of HF and TMAH. Commercial scrubbing equipment commonly has the ability to spin dry a scrubbed wafer, and thus the wafer may be dried in this manner within the scope of the present invention.

It should be understood that while certain specific cleaning protocols have been detailed above in connection with certain specified planarization processes and surface compositions, the specific cleaning protocols may be used with other planarization processes and surface compositions, and the residue resulting from the specified planarization processes and surface compositions may be removed by alternative cleaning procedures. The above are merely illustrative of the invention. For example, a semiconductor wafer having planarization residue thereon may be placed into a bath formed from water and TAAF. Thereafter, if necessary for complete cleaning, HF and/or TAAH may be added to the aqueous TAAF bath.

As suggested by the above examples, the cleaning composition and methods of the invention may desirably be tailored to the identity of the device surface. This is because, for example, while the cleaning composition and methods are very well-suited to removing residue from a device surface, the same composition and methods may also result in some removal of the atoms that form the surface of the device. Thus, while in a preferred embodiment, the inventive method removes only residue and not surface atoms, the inventive method may remove surface atoms in addition to removing residue. Thus, the inventive method should be practiced with a view to its effect on the planarized surface of the semiconductor device, as discussed further below.

According to a preferred embodiment of the invention, chemical mechanical polishing is the planarization process that provides a planar surface with residue thereon. The present invention is particularly suited to substantially removing all residue from a planarized surface that has been subjected to CMP, and is especially well-suited to removing residue resulting from a CMP process that employs silica as an abrasive and acts on doped silica substrate. That the aq. HF/TAAH composition of the invention is particularly well-suited for such CMP processes can be seen from the following described experiment.

The etch rates of an inventive cleaning composition (aqueous HF/TMAH) and a TMAH-free composition (aqueous HF) with both a doped and undoped silica substrate, were determined. To determine etch rate, a laminate having a top layer formed from a known thickness of silica was placed into a bath of each of the aforementioned compositions. After a measured time, the laminate was removed from the bath, and the thickness of the top layer was measured. The decrease in thickness of the top layer, divided by the time the layer was in the bath, provides the etch rate for the particular liquid composition and substrate composition.

TABLE 1 compares aqueous HF and aqueous HF/TMAH for their abilities to etch BPSG (a boron and phosphorous doped silica glass) and undoped silica (such as produced by the decomposition of tetraethylorthosilicate (TEOS)).

TABLE 1

Etch rates for aq. HF and aq. HF/TMAH with doped and undoped silica

| | Etch Rate ($Å/min$) | |
|---|---|---|
| Identity of substrate being etched | etchant is aq. HF | etchant is aq. HF/TMAH |
| Undoped Silica | 25 | 25 |
| Doped Silica (BPSG) | 250–400 | 55 |

TABLE 1 shows that the etch rate for undoped silica is about 25 $Å/min$ using either aqueous HF or aqueous HF/TMAH. However, when BPSG is being etched, the etch rate using aqueous HF is about 250–400 $Å/min$, while it is only about 55 $Å/min$ using aqueous HF/TMAH.

The inventive composition and methods are thus shown to be particularly well-suited for removing CMP-derived residue from a surface formed of doped silica. This is particularly the case when silicon dioxide is used as an abrasive in a CMP process, and the doped silica contains boron and/or phosphorus dopants, e.g., PSG or BPSG. Including TMAH in an aqueous HF cleaning composition has unexpectedly been found to dramatically retard the extent to which the composition dissolves (etches) doped silica, while having essentially no effect on the rate at which undoped silica is dissolved. In fact, the presence of TMAH may reduce by about five-fold the extent to which aqueous HF dissolves doped silica. Thus, the inventive composition is particularly useful in removing silica residue from a planarized BPSG surface.

The relative amounts of water, HF, TAAH and/or TAAF used to prepare the cleaning composition will influence the selectivity of the composition in removing residue versus removing atoms from the substrate surface itself. Routine experimentation may be needed in order to find a composition that provides optimal cleaning ability with minimal degradation of the semiconductor surface.

BPSG surfaces, and planarization of the same, are common features of semiconductor fabrication. For example, in the preparation of polysilicon plugs and containers in semiconductor devices, a layer of BPSG may be deposited over the plug or container. Thereafter, the BPSG layer may be planarized using a silica-containing slurry in a CMP process. It is desirable that all of the planarization residue, which typically includes particulate silica, be removed after the CMP process. However, it is undesirable that the BPSG layer be removed to the extent of exposing the underlying plug or container. Using a cleaning composition containing only water and hydrofluoric acid, the rate of BPSG removal is such that by the time the planarization residue is completely removed, sufficient BPSG has also been removed such that the underlying plug or container may be exposed. However, when TMAH (or other TAAH) is added to the aqueous HF cleaning solution, the rate of BPSG removal is sufficiently retarded (without effecting the rate of silica removal) that a layer of BPSG remains over the plug or container after complete removal of the planarization residue.

The following U.S. patents, which are fully incorporated herein by reference for all purposes and are exemplary only, provide details of semiconductor device manufacture wherein the semiconductor device contains plug and/or container features: U.S. Pat. Nos. 5,407,526; 5,340,763; and 5,354,705.

Having described the inventive cleaning composition, its manner of preparation and its use in removing residue formed during a planarization process, a preferred method according to the invention for semiconductor fabrication will be described in connection with FIG. 2. Thus, a device 10a having a substrate layer 12 and an overlying layer 14 is provided. The layer 14 has a surface 16 of uneven topography. In a first step, denoted (1) in FIG. 2, a planarization process (not shown) is used to remove material extending above the lowest point of the surface 16. As a consequence, the device 10b is formed, having a substrate layer 12 and an overlying layer 14 formed in part of a planar surface 18. In addition, sitting on top of the planar surface 18 is a residue 20 that is a consequence of the planarization process. "X" and "O" in FIG. 2 merely indicates that the residue 20 may comprise more than one chemical species.

Figure 2:
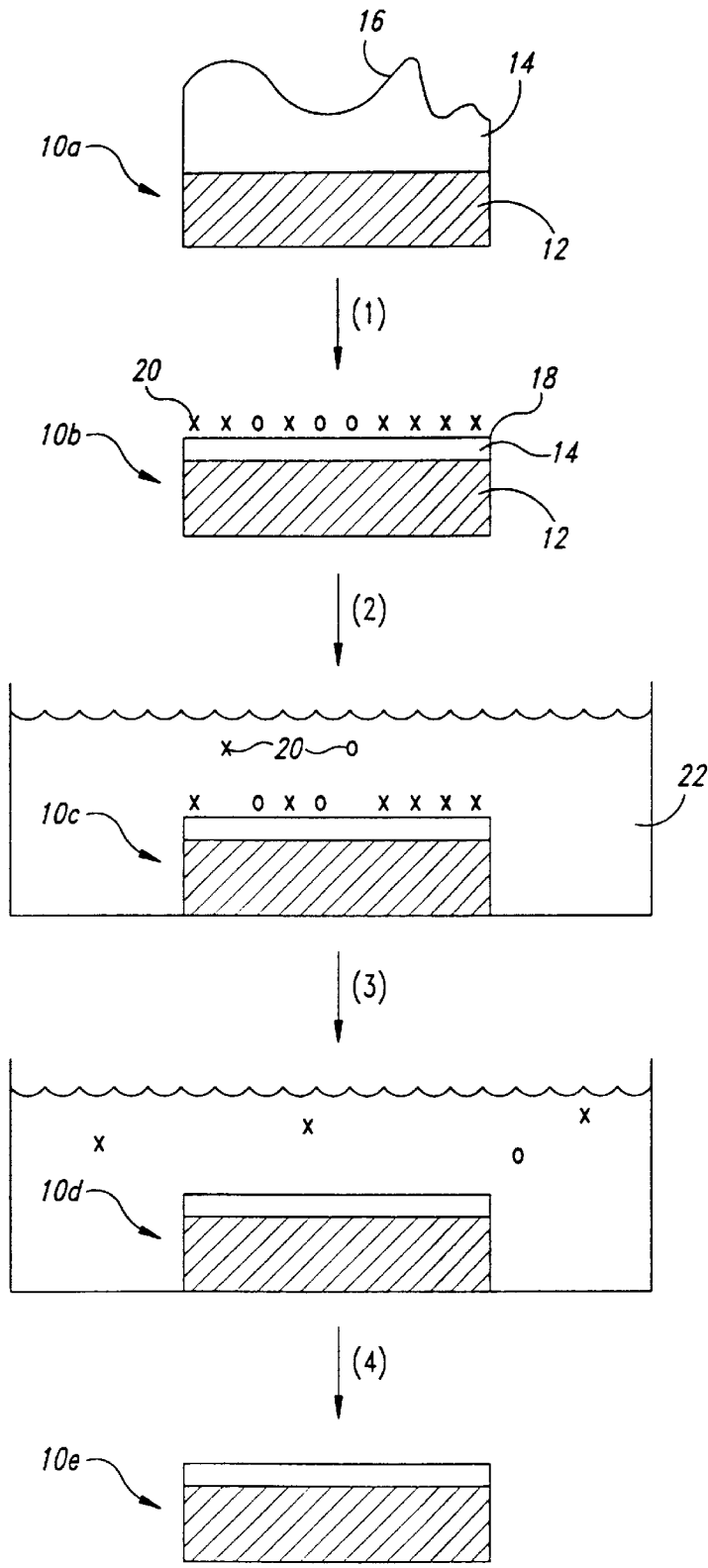
FIG. 2 is a flow diagram illustrating a process for fabricating a semiconductor device in accordance with the invention.

The planarization residue 20 is removed in a second step, denoted (2) in FIG. 2. In step (2), the device 10b is placed into a bath 22 prepared by combining water, HF and TMAH (or other TAAH). As shown in FIG. 2, the residue 20 starts to dissolve and/or become suspended in the bath 22, resulting in a partially clean device 10c. After some time has passed, denoted by step (3) in FIG. 2, substantially all of the planarization residue is suspended and/or dissolved in the bath 22, and the resulting device 10d has a surface 18 which is planar and essentially free of residue. In step (4), the device 10d is removed from the bath and dried to provide device 10e, which is ready to be modified by additional steps in semiconductor wafer fabrication.

Although the present invention has been described hereinabove primarily with reference to the removal of planarization residue resulting from chemical mechanical polishing of a semiconductor wafer, it should be understood that the invention can be applied to the removal of residue, debris, detritus, etc. (collectively "planarization residue") that results from other processes that may be performed during semiconductor fabrication. In this regard, it should be readily apparent to those skilled in the art that the present invention can be used to clean residue resulting from any planarization process that produces residue as a byproduct of planarization.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A process for removing planarization residue from a surface of a semiconductor wafer, comprising:

(a) providing a semiconductor wafer surface having residue thereon, where the residue is a consequence of a planarization process;

(b) contacting said residue with a cleaning composition such that at least some of said residue is removed, wherein said cleaning composition comprises tetraalkylammonium fluoride (TAAF) and solvent, wherein TAAF has the formula $(R)_4NF$ and each occurrence of R is independently selected from a $C_{1-22}$alkyl group.

2. The process of claim 1 wherein the solvent is selected from water, methanol, ethanol, n-propanol, iso-propanol, n-butanol, sec-butanol, iso-butanol, t-butanol, ethylene glycol and propylene glycol.

3. The process of claim 1 wherein the TAAF is tetramethylammonium fluoride.

4. The process of claim 1 wherein the concentration of TAAF in the cleaning composition is about 0.01 wt % to about 10 wt % based on the total weight of cleaning composition.

5. The composition of claim 1 wherein the concentration of TAAF in the cleaning composition is about 0.1 wt % to about 5 wt % based on the total weight of cleaning composition.

6. The process of claim 1 wherein the cleaning composition has an acidic pH.

7. The process of claim 6 wherein the acidic pH is about 1 to about 5.

8. The process of claim 1 wherein R is independently $C_{1-4}$alkyl at each occurrence.

9. The process of claim 1 wherein surfactant is present in the cleaning composition at a concentration of about 0.001 wt % to about 10 wt % based on the total weight of the cleaning composition.

10. The process of claim 1 wherein organic solvent is present in the cleaning composition at a concentration of about 0.01 wt % to 95 wt % based on the total weight of the cleaning composition.

11. The process of claim 1 wherein the residue is a consequence of chemical mechanical polishing.

12. The process of claim 11 wherein the residue comprises silica or alumina.

13. The process of claim 11 wherein the surface is comprised, at least in part, of doped silica.

14. The process of claim 11 wherein the surface is comprised, at least in part, of borophosphosilicate glass or phosphosilicate glass.

15. A process for fabricating a semiconductor device, comprising the steps:

(a) providing a semiconductor device having a surface;

(b) planarizing said surface to provide a planarized surface having residue thereon; and (c) contacting said residue with a cleaning composition to thereby remove at least some of said residue from at least a portion of said surface, wherein the cleaning composition comprises solvent and tetraalkylammonium fluoride (TAAF) of the formula $(R)_4NF$ wherein R is a $C_{1-22}$alkyl group independently selected at each location.

16. The process of claim 15 wherein said planarization is accomplished by chemical mechanical polishing.

17. The process of claim 15 wherein said planarization is accomplished by dry etch processing.

18. The process of claim 15 wherein said residue comprises silica or alumina.

19. The process of claim 15 wherein the solvent is selected from water, methanol, ethanol, n-propanol, iso-propanol, n-butanol, sec-butanol, iso-butanol, t-butanol, ethylene glycol and propylene glycol.

20. The process of claim 1 wherein the TAAF is tetramethylammonium fluoride.

21. The process of claim 1 wherein the concentration of TAAF in the cleaning composition is about 0.01 wt % to about 10 wt % based on the total weight of cleaning composition.

22. The composition of claim 1 wherein the concentration of TAAF in the cleaning composition is about 0.1 wt % to about 5 wt % based on the total weight of cleaning composition.

23. The process of claim 15 wherein the cleaning composition has a pH of about 1 to about 5.

24. The process of claim 15 wherein R is independently $C_{1-4}$alkyl at each occurrence.

25. The process of claim 15 wherein at least one optional ingredient selected from the group consisting of surfactant and organic solvent is present in the cleaning composition.

26. The process of claim 15 wherein said surface is comprised, at least in part, of doped silica.

27. The process of claim 26 wherein said doped silica is borophosphosilicate glass or borosilicate glass.

28. A process for removing planarization residue from a surface of a semiconductor wafer, comprising the steps:
 (a) providing a semiconductor wafer surface having residue thereon, where the residue is a consequence of a planarization process;
 (b) contacting said residue with a cleaning composition such that at least some of said residue is removed, wherein said cleaning composition has an acidic pH and is selected from (i) a composition comprising tetraalkylammonium fluoride (TAAF) and solvent, wherein TAAF has the formula $(R)_4NF$ and each occurrence of R is independently selected from a $C_{1-22}$alkyl group; and (ii) the combination of solvent, hydrofluoric acid (HF) and tetraalkylammonium hydroxide (TAAH), wherein TAAH has the formula $(R)_4NOH$ and each occurrence of R is independently selected from a $C_{1-22}$alkyl group.

29. The process of claim 28 wherein the cleaning composition results from the combination of water, hydrofluoric acid (HF) and tetraalkylammonium hydroxide (TAAH), wherein TAAH has the formula $(R)_4NOH$ and each occurrence of R is independently selected from a $C_{1-22}$alkyl group.

30. The process of claim 29 wherein the cleaning composition results from the combination of water, 49 wt % aqueous HF and 25 wt % aqueous TAAH in a water:HF:TAAH volume parts ratio of 100:0.01-100:0.01-100.

31. The process of claim 30 wherein the volume parts ratio is 100:0.1-10:0.1-10.

32. The process of claim 30 wherein the volume parts ratio is 100:0.5-2:0.5-5.

33. The process of claim 29 wherein TAAH is tetramethylammonium hydroxide.

34. The process of claim 28 wherein the solvent is selected from water, methanol, ethanol, n-propanol, iso-propanol, n-butanol, sec-butanol, iso-butanol, t-butanol, ethylene glycol and propylene glycol.

35. The process of claim 28 wherein the cleaning composition comprises solvent and tetraalkylammonium fluoride (TAAF) of the formula $(R)_4NF$ and each occurrence of R is independently selected from a $C_{1-22}$alkyl group.

36. The process of claim 35 wherein the TAAF is tetramethylammonium fluoride.

37. The process of claim 35 wherein the concentration of TAAF in the cleaning composition is about 0.01 wt % to about 10 wt % based on the total weight of cleaning composition.

38. The composition of claim 35 wherein the concentration of TAAF in the cleaning composition is about 0.1 wt % to about 5 wt % based on the total weight of cleaning composition.

39. The process of claim 28 wherein the acidic pH is about 1 to about 5.

40. The process of claim 28 wherein R is independently $C_{1-4}$alkyl at each occurrence.

41. The process of claim 28 wherein surfactant is present in the cleaning composition at a concentration of about 0.001 wt % to about 10 wt % based on the total weight of the cleaning composition.

42. The process of claim 28 wherein organic solvent is present in the cleaning composition at a concentration of about 0.01 wt % to 95 wt % based on the total weight of the cleaning composition.

43. The process of claim 28 wherein a semiconductor wafer surface having residue thereon is contacted with a composition comprising water and a single one of HF and TAAH, and then one of HF and TAAH is added to the composition to form a composition that results from the combination of water, HF and TAAH.

44. The process of claim 28 wherein the residue is a consequence of chemical mechanical polishing.

45. The process of claim 44 wherein the residue comprises silica or alumina.

46. The process of claim 44 wherein the surface is comprised, at least in part, of doped silica.

47. The process of claim 43 wherein the surface is comprised, at least in part, of borophosphosilicate glass or phosphosilicate glass.

48. A process for removing planarization residue from a surface of a semiconductor wafer, comprising the steps:
 (a) providing a semiconductor wafer surface having residue thereon, where the residue is a consequence of a planarization process;
 (b) contacting said residue with a cleaning composition such that at least some of said residue is removed, wherein said cleaning composition comprises organic solvent at a concentration of about 0.01 wt % to 95 wt % based on the total weight of the cleaning composition, and the cleaning composition is further selected from (i) a composition comprising tetraalkylammonium fluoride (TAAF) and solvent, wherein TAAF has the formula $(R)_4NF$ and each occurrence of R is independently selected from a $C_{1-22}$alkyl group; and (ii) the combination of solvent, hydrofluoric acid (HF) and tetraalkylammonium hydroxide (TAAH), wherein TAAH has the formula $(R)_4NOH$ and each occurrence of R is independently selected from a $C_{1-22}$alkyl group.

49. The process of claim 48 wherein the cleaning composition comprises the reaction product of hydrofluoric acid (HF) and tetraalkylammonium hydroxide (TAAH), wherein TAAH has the formula $(R)_4NOH$ and each occurrence of R is independently selected from a $C_{1-22}$alkyl group.

50. The process of claim 49 wherein the cleaning composition comprises the reaction product of 49 wt % aqueous HF and 25 wt % aqueous TAAH in a water:HF:TAAH volume parts ratio of 100:0.01-100:0.01-100.

51. The process of claim 50 wherein the volume parts ratio is 100:0.1-10:01-10.

52. The process of claim 50 wherein the volume parts ratio is 100:0.5-2:0.5-5.

53. The process of claim 49 wherein TAAH is tetramethylammonium hydroxide.

54. The process of claim 48 wherein the organic solvent is selected from methanol, ethanol, n-propanol, iso-propanol, n-butanol, sec-butanol, iso-butanol, t-butanol, ethylene glycol and propylene glycol.

55. The process of claim 48 wherein the cleaning composition comprises tetraalkylammonium fluoride (TAAF) of the formula $(R)_4NF$ and each occurrence of R is independently selected from a $C_{1-22}$alkyl group.

56. The process of claim 55 wherein the TAAF is tetramethylammonium fluoride.

57. The process of claim 55 wherein the concentration of TAAF in the cleaning composition is about 0.01 wt % to about 10 wt % based on the total weight of cleaning composition.

58. The composition of claim 55 wherein the concentration of TAAF in the cleaning composition is about 0.1 wt % to about 5 wt % based on the total weight of cleaning composition.

59. The process of claim 48 wherein the cleaning composition has an alkaline pH.

60. The process of claim 59 wherein the alkaline pH is about 9 to about 13.

61. The process of claim 48 wherein the cleaning composition has an acidic pH.

62. The process of claim 48 wherein the acidic pH is about 1 to about 5.

63. The process of claim 48 wherein R is independently $C_{1-4}$alkyl at each occurrence.

64. The process of claim 48 wherein surfactant is present in the cleaning composition at a concentration of about 0.001 wt % to about 10 wt % based on the total weight of the cleaning composition.

65. The process of claim 48 wherein the organic solvent is present in the cleaning composition at a concentration of about 0.01 wt % to 95 wt % based on the total weight of the cleaning composition.

66. The process of claim 48 wherein a semiconductor wafer surface having residue thereon is contacted with a single one of HF and TAAH, and then one of HF and TAAH is added to the composition to form a composition that results from the combination of HF and TAAH.

67. The process of claim 48 wherein the residue is a consequence of chemical mechanical polishing.

68. The process of claim 67 wherein the residue comprises silica or alumina.

69. The process of claim 67 wherein the surface is comprised, at least in part, of doped silica.

70. The process of claim 67 wherein the surface is comprised, at least in part, of borophosphosilicate glass or phosphosilicate glass.

* * * * *

UNITED STATES PATENT AND TRADEMARK OFFICE
CERTIFICATE OF CORRECTION

PATENT NO.  : 6,044,851
DATED       : April 4, 2000
INVENTOR(S) : Eric K. Grieger, Michael T. Andreas and Michael A. Walker It is certified that error appears in the above-identified patent and that said Letters Patent is hereby corrected as shown below:

Column 15,
Lines 7 and 9, reads "The process of claim 1" should read -- The process of claim 15 --
Line 13, reads "The composition of claim 1" should read -- The composition of claim 15 --

Column 16,
Line 67, reads "100:0.1-10:01-10" should read -- 100:0.1-10:0.1-10 --

Signed and Sealed this

Fourth Day of February, 2003

JAMES E. ROGAN
*Director of the United States Patent and Trademark Office*